US005637903A

United States Patent [19]
Liao et al.

[11] Patent Number: 5,637,903
[45] Date of Patent: Jun. 10, 1997

[54] DEPLETED GATE TRANSISTOR FOR HIGH VOLTAGE OPERATION

[75] Inventors: Siu-han Liao, Hsin-Chu, Taiwan; Ling Chen, Sunnyvale, Calif.

[73] Assignee: Taiwan Semiconductor Manufacturing Company Ltd., Hsin-Chu, Taiwan

[21] Appl. No.: 558,490

[22] Filed: Nov. 16, 1995

Related U.S. Application Data

[62] Division of Ser. No. 416,166, Apr. 4, 1995, Pat. No. 5,480,830.
[51] Int. Cl.⁶ .................. H01L 29/76; H01L 29/94
[52] U.S. Cl. .................. 257/412; 257/413; 438/217
[58] Field of Search .................. 257/412, 413; 437/40, 44

[56] References Cited

U.S. PATENT DOCUMENTS

| | | | |
|---|---|---|---|
| 4,822,749 | 4/1989 | Flanner et al. | 257/412 |
| 4,873,204 | 10/1989 | Wong et al. | 437/200 |
| 4,937,657 | 6/1990 | DeBlasi et al. | 257/412 |
| 5,047,358 | 9/1991 | Kosiak et al. | 437/34 |
| 5,121,186 | 6/1992 | Wong et al. | 257/412 |
| 5,312,768 | 5/1994 | Gonzalez | 437/40 |
| 5,340,761 | 8/1994 | Loh et al. | 437/44 |

Primary Examiner—Mahshid D. Saadat
Assistant Examiner—Valencia Martin Wallace
Attorney, Agent, or Firm—George O. Saile

[57] ABSTRACT

A process for fabricating MOSFET structures, using one gate oxide thickness, but resulting in both low and high operating voltage devices, has been developed. A fabrication sequence is described illustrating the process that allows the formation of a depleted gate polysilicon structure, resulting in high operating voltages, and doped polysilicon gate structures, resulting in lower operating voltages.

2 Claims, 3 Drawing Sheets

DEPLETED GATE TRANSISTOR FOR HIGH VOLTAGE OPERATION

This is a division of application Ser. No. 08/416,166 filed Apr. 4, 1995 now U.S. Pat. No. 5,480,830.

BACKGROUND OF THE INVENTION

1. Field of the Invention

The present invention relates to a process used for fabricating metal oxide semiconductor field effect transistors, (MOSFET), devices, and more specifically to a process that allows different operating voltage devices to be obtained, while using only one gate oxide thickness.

2. Description of Prior Art

The ability to build faster and less costly complimentary metal oxide semiconductor, (CMOS), devices, is directly related to the ability of the semiconductor industry to achieve device micro-miniaturization. Smaller chip features result in a greater amount of chips per wafer, thus reducing the cost of CMOS chips. Device micro-miniaturization has been accomplished basically by the advances in specific semiconductor fabrication disciplines, such as photolithography and reactive ion etching, (RIE). Advances in terms of more sophisticated exposure cameras, as well as the development of more sensitive photoresist materials, have allowed sub-micron images to be routinely obtained in photoresist layers. Also rapid development of dry etching, using anisotropic processes, have in turn allowed the sub-micron images in photoresist to be successfully transferred to underlying semiconductor materials.

Another trend in the semiconductor industry has been to build higher performing CMOS devices. Efforts have been made to reduce the channel length of CMOS devices. The ability to reduce channel lengths, or source to drain spacing, depend on the ability to reduce the image size of the polysilicon gate, which is used as a mask for the self aligned source and drain process. Therefore the advances in photolithography and RIE disciplines also contribute to increases in device performance, as well as the previously mentioned cost benefits. Performance increases have also been realized from incremental reductions in capacitances. Gate insulators, composed of silicon dioxide, in the range of less then 100 Angstroms have been routinely used. The use of thin gate oxides can sometimes restrict the use of specific voltages, that may be large enough to create gate dielectric wearout or breakdown problems. Therefore to obtain the high performance with the use thin gate oxides, for specific CMOS chip locations, while insuring against wearout phenomena in other CMOS locations, where higher voltages are needed, engineers designed CMOS processes that satisfied both demands. This has been accomplished by creating thicker gate oxides, for areas using higher gate voltages, and using the thinner insulator, in regions demanding performance. However the ability to fabricate different gate insulator thicknesses on the same CMOS chip, can be costly and can also result in overall yield loss due to contamination phenomena. The simplest method for producing two thicknesses of gate insulator is: grow a gate oxide to a specific thickness; mask via photoresist techniques; etch away the first oxide from areas needing the other gate thickness; remove the masking photoresist; carefully clean the substrate; and grow the other thickness of gate oxide. This process is costly due to the increased process steps, as well as possibly yield limited, due to the organic processing used between gate oxidations.

Another method, will now be described in this invention, that will allow CMOS structures to perform at different operating voltages, while using only one gate oxide thickness. The method used will be to fabricate polysilicon gate electrodes, one doped in a conventional manner, while the gate supporting the higher voltage demands will be created using an intrinsic polysilicon gate interface. In U.S. Pat. No. 4,249,968, Gardiner, etal, described a polysilicon gate that was created via chemical vapor deposition of polysilicon which included a graded, insitu phosphorous doping procedure. The inventors started with an intrinsic layer of polysilicon and gradually increased the phosphorous introduction as the deposition proceeded. This was done primarily to avoid large grain growth of polysilicon, at the gate oxide interface, during subsequent high temperature procedures. The growth of the grains increased with increasing phosphorous concentration, and thus by initially limiting the amount of phosphorous doping, at the polysilicon—gate oxide interface, the polysilicon grain growth was limited. In this invention depleted gate CMOS devices, will be fabricated, using a doped polysilicon gate for the low operating voltage device, while a undoped, or partially doped polysilicon gate will be used for the device requiring higher operating voltages.

SUMMARY OF THE INVENTION

It is an object of this invention to provide a process for fabricating CMOS devices that can operate at different operating voltages, while using a specific gate oxide thickness.

It is another object of this invention to create a doped polysilicon gate on a thin gate oxide, for areas of high CMOS performance, while using an undoped, or partially doped polysilicon gate to interface the same gate oxide, areas where higher voltages are needed.

It is still another object of this invention to use a metal silicide layer to protect the undoped depleted gate polysilicon from the source and drain doping process.

In accordance with this present invention a method is described for fabricating depleted gate CMOS devices, in which specific regions of the device are fabricated using a doped polysilicon gate, while other regions are fabricated using undoped polysilicon gates. Thick field oxide regions are grown for purposes of isolation, followed by the growth of a gate oxide. Low pressure chemical vapor deposition, (LPCVD), processing is then used to deposit an undoped polysilicon layer followed by a TEOS deposited oxide. Photoresist patterning of the oxide, and removal of the oxide, in regions in which the low operating voltage transistors are to be formed, is then performed. The unprotected polysilicon regions are then subjected to an ion implantation, or POCl3 doping step. After removal of the TEOS oxide mask, a metal silicide is formed on both the doped and undoped regions of the polysilicon layer, followed by photoresist patterning, and reactive ion etching, to produce the desired gate structure in the metal silicide-polysilicon layers. Another ion implantation step is then performed to create the source and drain regions, for both the low and high operating voltage transistors.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming depleted gate CMOS devices, for high voltage applications, will now be covered in detail. The depleted gate CMOS device can be used as part of MOSFET devices that are currently being manufactured in industry, therefore only the specific areas unique to understanding this invention will be described in detail.

Figure 1:
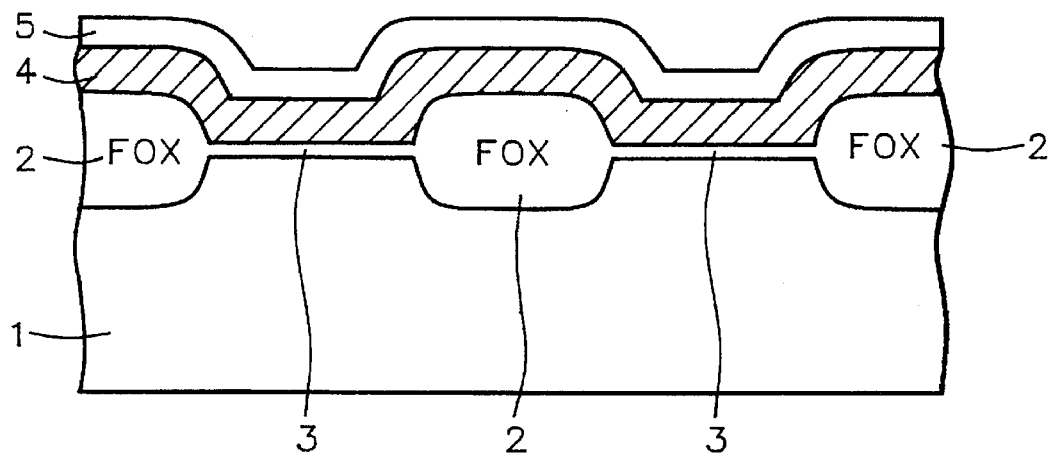
FIG 1–6, which schematically illustrate, in cross-sectional representation, the fabrication sequence used to create the depleted gate CMOS device.

A substrate, 1, consisting of P type silicon, with a <100> crystallographic orientation, is used and shown in FIG. 1. Thick oxide regions, 2, are created for isolation purposes. Briefly the process used to create the isolating oxide regions initiates with the growth of a thin underlying thermal oxide, followed by the deposition of a thin layer of silicon nitride, using LPCVD techniques. After photoresist processing, used to define the desired isolation image in the masking photoresist, reactive ion etching, (RIE), is used to transfer the desired image to the underlying silicon nitride-silicon dioxide layers. After photoresist removal, and careful chemical cleans, the thick field oxide regions, (FOX), 2, are thermally grown, in an oxygen-steam ambient, at a temperature between about 900° to 1050° C., to a thickness between about 4000 to 6000 Angstroms. The masking layers are then removed using a hot phosphoric acid solution, for silicon nitride, while a buffered hydrofluoric acid solution is used to remove the silicon dioxide layer. Next a silicon dioxide gate insulator, 3, is grown in an oxygen-steam ambient, at a temperature between about 800° to 900° C., to a thickness between about 70 to 150 Angstroms. The deposition of an undoped polysilicon layer, 4, using LPCVD is then carried out at temperature between about 580° to 640° C. to a thickness between about 1000 to 3000 Angstroms. An insulator layer, 5, of silicon oxide, produced via LPCVD using tetraethylorthosilicate, (TEOS), as a source, is next performed at a temperature between about 650° C. to 750° C. The thickness of the TEOS grown oxide is vital to this invention, since it will be subsequently used as a mask that will block the implantation of dopants into the underlying polysilicon layer, and thus allow the depleted gate to be created. Therefore the thickness of the TEOS oxide used is between about 500 to 3000 Angstroms.

Figure 2:
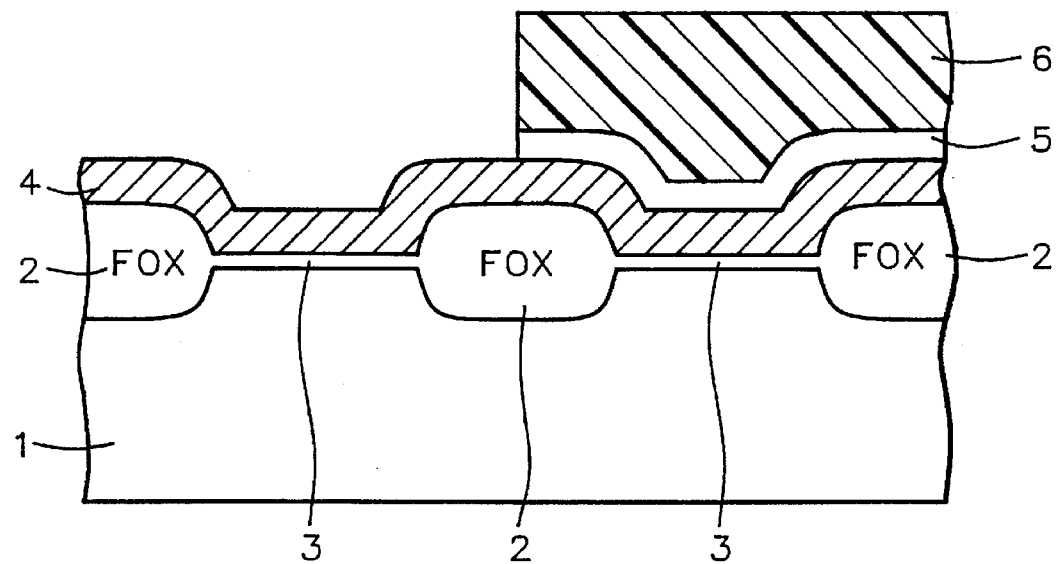

Photoresist patterning, 6, shown in FIG. 2, is now used to block out regions in which the high operating voltage, or depleted gate devices are to be built. The resist pattern is used as a mask to allow for the removal of TEOS oxide to occur, and to expose the polysilicon regions in which the conventional low operating voltage, or high performance devices are to be constructed. The wet etch procedure is performed in a buffered hydrofluoric acid solution. It should be noted that the etching of the TEOS oxide can also be accomplished via RIE procedures using CF4 or CF4 and H2, resulting in a TEOS oxide structure, 5.

Figure 3:
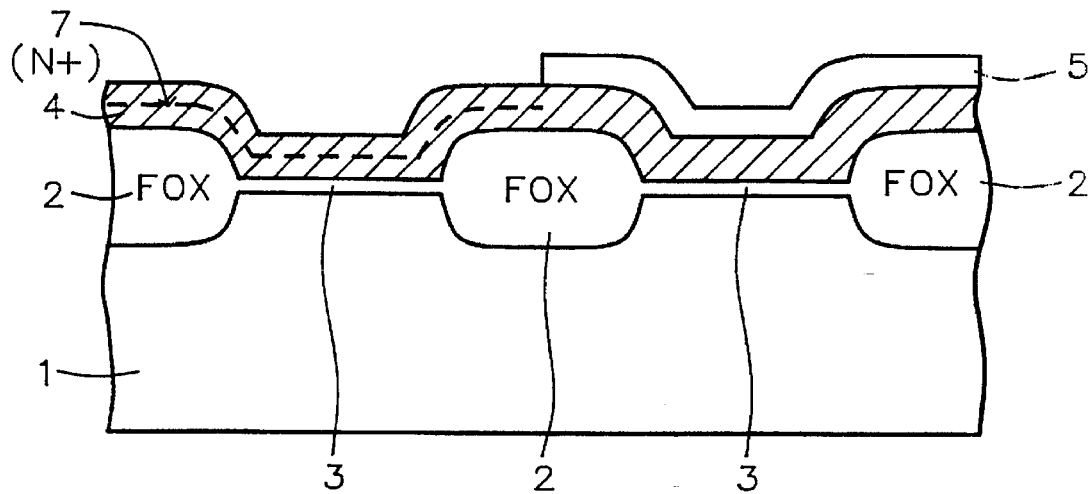

After photoresist removal, an ion implantation procedure is applied to the polysilicon region not masked by TEOS oxide island, 5. The ion implantation dopant, 7, shown in FIG. 3, is P31, obtained using an energy between about 25 to 50 Kev., or arsenic, obtained using an energy between about 50 to 120 Kev., both dopants at a dose between about 2E15 to 6E15 atoms/cm2. The energy used was chosen so that the projected range of implanted spieces, in combination with the thickness of masking TEOS oxide, 5, would not allow doping of the underlying polysilicon to occur, and thus the formation of the high operating voltage, depleted gate devices, can subsequently be achieved. The polysilicon region receiving the implant dose will be used for the conventional high performance, low operating voltage CMOS devices. Another method that can be used to dope the polysilicon region, while maintaining intrinsic polysilicon for the depleted gate structure, is via POC13 doping processes. This can be accomplished, again using TEOS oxide, 5, as a mask, at a temperature between about 800° to 900° C.

Figure 4:
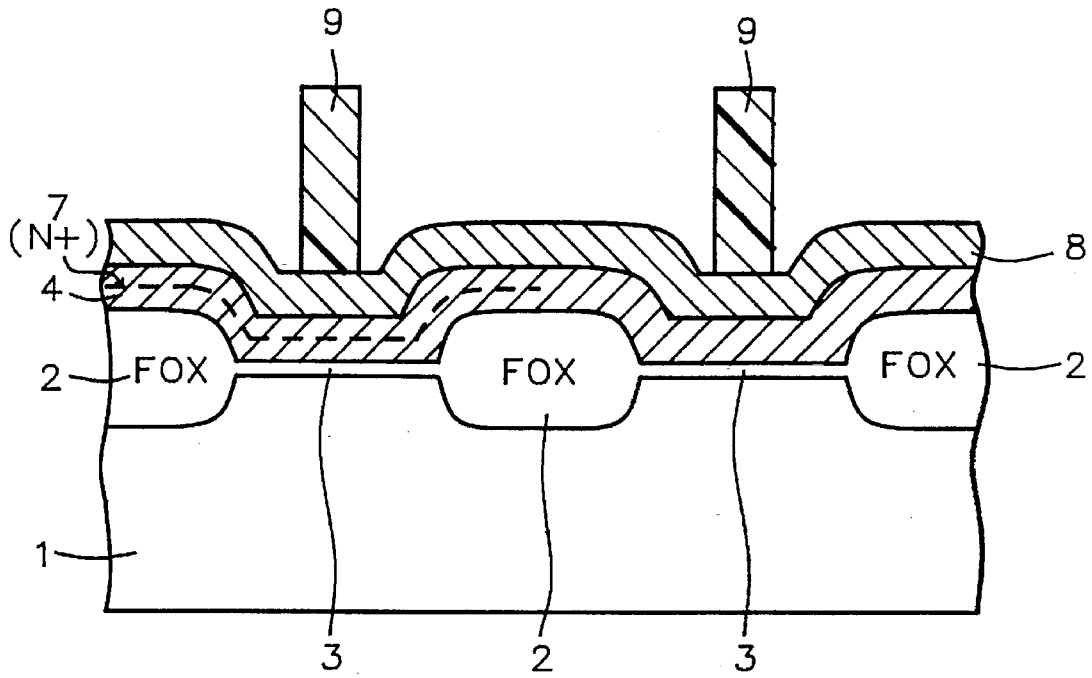

The TEOS oxide island, 5, is now removed, again via the use of a buffered hydrofluoric acid solution. Next a layer of tungsten silicide, 8, (WSi) is deposited using CVD processing, to a thickness between about 1000 to 3000 Angstroms. Conventional photoresist procedures are then applied to define the desired image of gate structure, shown as photoresist image, 9., in FIG. 4.

Reactive ion etching procedures are then employed, using SF6 and HBr to etch the polycide structure. After photoresist removal, and careful wet chemical cleans, a lightly doped source and drain region, (LDD), 10, is formed. The N type LDD is accomplished via ion implantation of P31, at an energy between about 25 to 60 Kev., at a dose between about 1E13 to 5E13 atoms/cm2.

Figure 5:
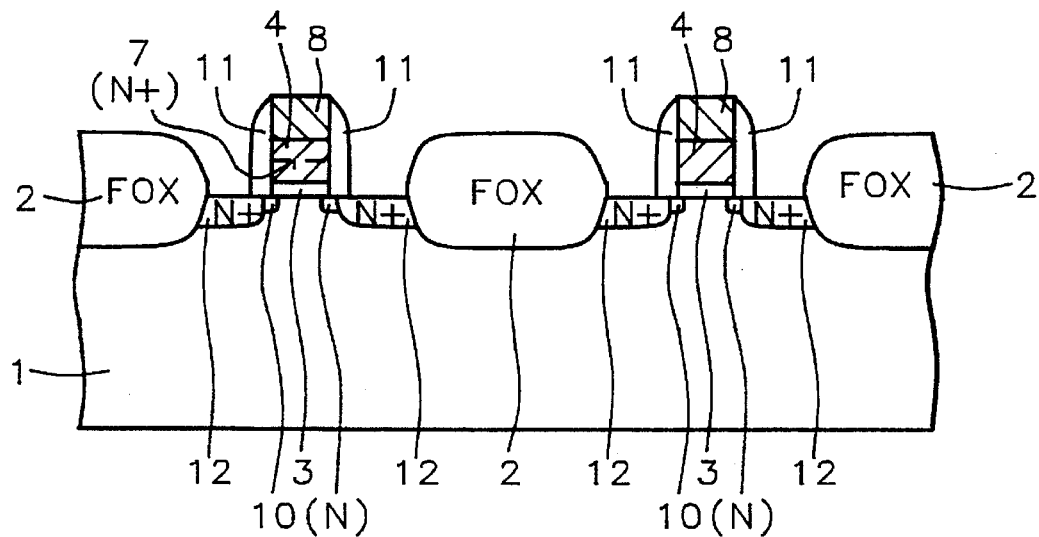
Figure 6:
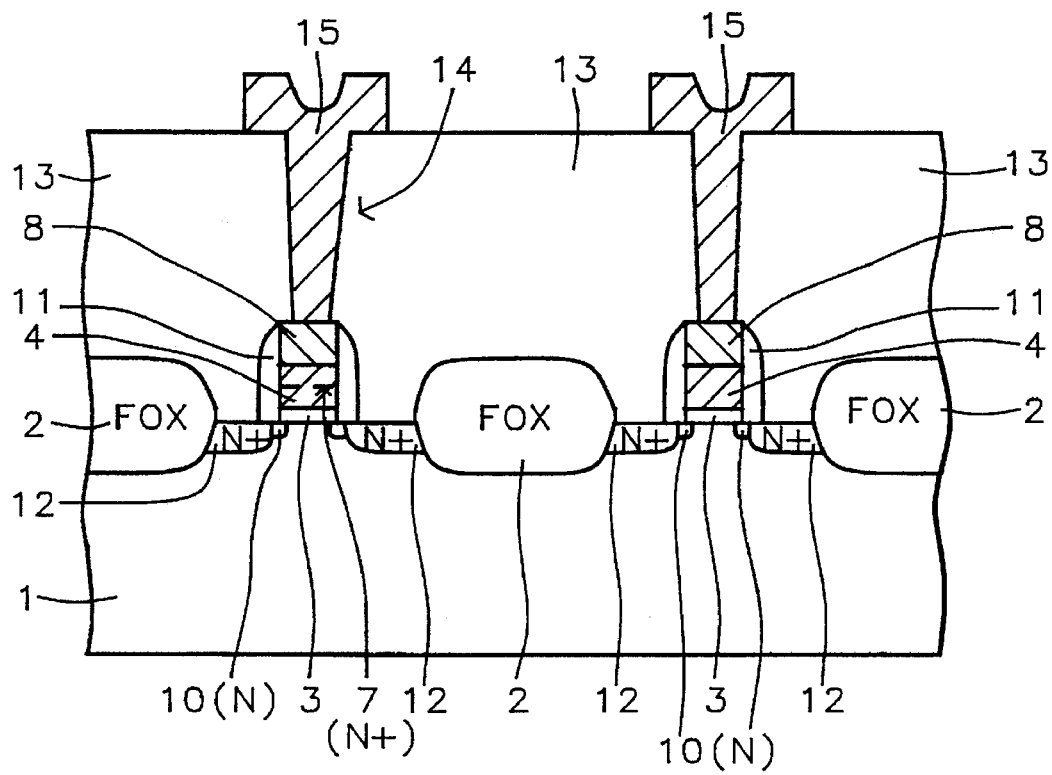

Next a deposition of TEOS oxide is performed at a temperature between about 650° to 750° C., to a thickness between about 1000 to 3000 Angstroms. An anisotropic reactive ion etch is then performed, using CHF3 and CF4, to create the TEOS sidewall spacer, 11, shown in FIG. 5. After the spacer formation and careful wet chemical cleans, a ion implantation step, used to create the source and drain regions, 12, for both the conventional, and depleted gate, CMOS devices, is performed. The implantation is performed using arsenic, at an energy between about 25 to 70 Kev., at a dose between about 2E15 to 6E15 atoms/cm2. It should be noted that the thickness of tungsten silicide, and the implantation energy used, were chosen such that the dopant would not reach the underlying polysilicon gate structure. Therefore the creation of the undoped, depleted gate, is not compromised by this source and drain doping process. This is shown schematically in FIG. 5. An activation process using rapid thermal annealing, (RTA), is next performed to activate the implanted spieces. This is accomplished at a temperature between about 900° to 1100° C., for a time between about 20 to 60 sec.

Finally, a oxide layer, 13, is deposited using CVD processing, at a temperature between about 380° to 480° C., to a thickness between about 6000 to 12000 Angstroms. Standard photolithography and RIE processing is then used to create vias 14, to both the depleted polysilicon gate, as well as to the conventional polysilicon gate. Via holes are also made to the source and drain regions, (not shown). Metallization, in the form of Al—Cu—Si is obtained using rf sputtering, to a thickness between about 5000 to 12000 Angstroms. Again standard photolithographic and RIE processing is employed, to create the metal contacts, 15, to the polysilicon gates. The RIE processing is performed using a C12 and BC13 based etchant.

The process for creating depleted gate, high operating voltage devices, although shown in an NFET design, can be applied to P type, (PFET), devices. In addition BiCMOS, (bipolar-CMOS), device can also be fabricated using this invention.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, comprising:
   three field oxide regions, on the surface of a semiconductor substrate, comprised of a first field oxide region in the center of said semiconductor substrate, and a second field oxide region, and a third field oxide region, located at the peripheral of said semiconductor substrate;

a first device region between, said first field oxide region, in the center of said semiconductor substrate, and said second field oxide region, located at the peripheral of said semiconductor substrate;

a second device region between, said first field oxide region, and said third field oxide region, located at the peripheral of said semiconductor substrate;

a first polycide gate structure, comprised of a first, overlying metal silicide layer, and an underlying, undoped, polysilicon layer, in center of said first device region;

a second polycide gate structure, comprised of a second, overlying metal silicide layer, and an underlying, doped polysilicon layer, in center of said second device region, wherein said second, overlying metal silicide layer, of said second polycide gate structure, is tungsten silicide, at a thickness between about 1000 to 3000 Angstroms, overlying said underlying, doped polysilicon layer, doped with arsenic at a dose between about 2E15 to 6E15 atoms/cm$^2$;

a first source and drain region in the surface of said semiconductor substrate, in said first device region, between said first polycide gate structure, and said first field oxide region, and a first source and drain region between said first polycide gate structure and said second field oxide region;

a second source and drain region in the surface of said semiconductor substrate, in said second device region, between said second polycide gate structure, and said first field oxide region, and a second source and drain region between said second polycide gate structure, and said third field oxide region;

an insulator spacer located on sides of said first polycide gate structure, and on the sides of said second polysilicon gate structure;

an oxide layer on said first source and drain regions, on said second source and drain regions, on said first polycide gate structure, on said polycide gate structure, and on said field oxide regions;

contact holes opened in said oxide layer, to said first polycide gate structure, and to said second polycide gate structure; and contact metallization to said first polycide gate structure, and to said second polycide gate structure.

2. The MOSFET device structure of claim 1, wherein said first overlying metal silicide layer, of said first polycide gate structure, is tungsten silicide, at a thickness between about 1000 to 3000 Angstroms, overlying said, underlying, undoped polysilicon layer.

* * * * *